(12) United States Patent
Andreev et al.

(10) Patent No.: US 8,347,167 B2
(45) Date of Patent: Jan. 1, 2013

(54) CIRCUITS FOR IMPLEMENTING PARITY COMPUTATION IN A PARALLEL ARCHITECTURE LDPC DECODER

(75) Inventors: Alexander Andreev, San Jose, CA (US); Vojislav Vukovie, Santa Clara, CA (US); Igor Vikhliantsev, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 781 days.

(21) Appl. No.: 12/339,667

(22) Filed: Dec. 19, 2008

(65) Prior Publication Data

US 2010/0162071 A1   Jun. 24, 2010

(51) Int. Cl.
*H03M 13/00* (2006.01)
(52) U.S. Cl. ....................................................... 714/752
(58) Field of Classification Search .................. 714/752, 714/799–801
See application file for complete search history.

(56) References Cited

U.S. PATENT DOCUMENTS

| | | | |
|---|---|---|---|
| 6,965,652 B1 | 11/2005 | Burd et al. | |
| 7,017,106 B2 | 3/2006 | Shen et al. | |
| 7,107,511 B2 | 9/2006 | Shen et al. | |
| 7,174,495 B2 | 2/2007 | Boutillon et al. | |
| 7,178,081 B2 | 2/2007 | Lee et al. | |
| 7,184,486 B1 | 2/2007 | Wu et al. | |
| 7,222,289 B2 | 5/2007 | Hung | |
| 7,328,398 B2 | 2/2008 | Shen et al. | |
| 7,383,485 B2 | 6/2008 | Tran et al. | |
| 7,395,487 B2 | 7/2008 | Tran et al. | |
| 7,398,453 B2 | 7/2008 | Yu | |
| 7,409,628 B2 | 8/2008 | Tran et al. | |
| 7,644,339 B2 * | 1/2010 | Tran et al. | 714/758 |
| 2007/0245217 A1 * | 10/2007 | Valle | 714/758 |
| 2008/0134008 A1 | 6/2008 | Andreev et al. | |
| 2008/0168334 A1 | 7/2008 | Gribok et al. | |
| 2008/0178057 A1 | 7/2008 | Andreev et al. | |
| 2010/0107030 A1 * | 4/2010 | Graef | 714/752 |

FOREIGN PATENT DOCUMENTS

| | | |
|---|---|---|
| WO | 2006073322 A1 | 7/2006 |
| WO | 2007001135 A1 | 1/2007 |

OTHER PUBLICATIONS

Nguyen et al., "Design of a Low Density Parity Check Iterative Decoder," 2002, pp. 1-6, Berkeley, CA, USA.

* cited by examiner

*Primary Examiner* — Scott Baderman
*Assistant Examiner* — Joseph Kudirka
(74) *Attorney, Agent, or Firm* — Duft Bornsen & Fishman LLP

(57) ABSTRACT

A parity unit circuit for use in a parallel, pipelined, low density parity check (LDPC) decoder that implements an iterative, min-sum, message passing LDPC algorithm. The parity unit provides a memory logic block for storing information relating to a current and next iteration of the LDPC computations and includes a "compute 1" logic block for computing a parity message (with sign) for application to related bit nodes and a "compute2" logic block for updating the data stored in the memory logic block for a next iteration of the LDPC decoder.

4 Claims, 9 Drawing Sheets

FIG. 2

$$H = \begin{bmatrix}
00100000\ 00000001\ 00001000\ 00000100\ 01000000\ 10000000\ 00000010 \\
00010000\ 10000000\ 00000100\ 00000010\ 00100000\ 01000000\ 00000001 \\
00001000\ 01000000\ 00000010\ 00000001\ 00010000\ 00100000\ 10000000 \\
00000100\ 00100000\ 00000001\ 10000000\ 00001000\ 00010000\ 01000000 \\
00000010\ 00010000\ 10000000\ 01000000\ 00000100\ 00001000\ 00100000 \\
00000001\ 00001000\ 01000000\ 00100000\ 00000010\ 00000100\ 00010000 \\
10000000\ 00000100\ 00100000\ 00010000\ 00000001\ 00000010\ 00001000 \\
01000000\ 00000010\ 00010000\ 00001000\ 10000000\ 00000001\ 00000100 \\
\\
10000000\ 00100000\ 01000000\ 00000100\ 00010000\ 00001000\ 00000001 \\
01000000\ 00010000\ 00100000\ 00000010\ 00001000\ 00000100\ 10000000 \\
00100000\ 00001000\ 00010000\ 00000001\ 00000100\ 00000010\ 01000000 \\
00010000\ 00000100\ 00001000\ 10000000\ 00000010\ 00000001\ 00100000 \\
00001000\ 00000010\ 00000100\ 01000000\ 00000001\ 10000000\ 00010000 \\
00000100\ 00000001\ 00000010\ 00100000\ 10000000\ 01000000\ 00001000 \\
00000010\ 10000000\ 00000001\ 00010000\ 01000000\ 00100000\ 00000100 \\
00000001\ 01000000\ 10000000\ 00001000\ 00100000\ 00010000\ 00000010 \\
\\
10000000\ 10000000\ 10000000\ 10000000\ 10000000\ 10000000\ 10000000 \\
01000000\ 01000000\ 01000000\ 01000000\ 01000000\ 01000000\ 01000000 \\
00100000\ 00100000\ 00100000\ 00100000\ 00100000\ 00100000\ 00100000 \\
00010000\ 00010000\ 00010000\ 00010000\ 00010000\ 00010000\ 00010000 \\
00001000\ 00001000\ 00001000\ 00001000\ 00001000\ 00001000\ 00001000 \\
00000100\ 00000100\ 00000100\ 00000100\ 00000100\ 00000100\ 00000100 \\
00000010\ 00000010\ 00000010\ 00000010\ 00000010\ 00000010\ 00000010 \\
00000001\ 00000001\ 00000001\ 00000001\ 00000001\ 00000001\ 00000001
\end{bmatrix}$$

CIRCUITS FOR IMPLEMENTING PARITY COMPUTATION IN A PARALLEL ARCHITECTURE LDPC DECODER

BACKGROUND

1. Field of the Invention

The invention relates generally to a low density parity check (LDPC) decoder and more specifically relates to circuits to implement a parity unit in a parallel, pipelined, LDPC decoder.

2. Related Patents

This patent is related to commonly owned U.S. Ser. No. 11/565,670 entitled "Parallel LDPC Decoder" filed on 1 Dec. 2006 which is hereby incorporated by reference. This patent is also related to commonly owned U.S. Ser. No. 11/613,256 entitled "Low Complexity LDPC Encoding Algorithm" filed on 20 Dec. 2006 which is hereby incorporated by reference. This patent is related to commonly owned U.S. Ser. No. 11/626,400 entitled "Pipelined LDPC Arithmetic Unit" filed on 24 Jan. 2007 which is hereby incorporated by reference.

In digital channels, such as digital telecommunications and data storage read channels, error detection and correction is a key to the speed and reliability of the digital data exchanged. LDPC encoding and decoding is one of the best performing channel codes (encoding and decoding) known at present. It provides both robust error detection and correction and, with careful design, can provide high performance for error detection and correction at very high data rates.

In general, LDPC codes are linear block codes defined by a sparse matrix "H" called the parity check matrix. A column of H is associated with a codeword bit and each row corresponds to a parity check of codeword. A non-zero element in a row means that the corresponding column (e.g., bit of the codeword) contributes to this row's parity check.

Often an LDPC code is described by a so called "Tanner" graph in which a check node corresponds to each row of the parity check matrix and a bit node corresponds to each column of the parity check matrix. Edges connect a bit node to a check node if the column corresponding to the bit node contributes to the parity check of the row corresponding to the check node. This Tanner graph model is also suggestive of an architecture of an LDPC decoder in which bit nodes and check nodes exchange messages (e.g., log-likelihood or LLR messages) to converge through an iterative process on a determination of whether a codeword received on the digital channel is correct or is in error. The bit nodes provide an estimated value of a corresponding bit of a codeword and the check nodes compute a degree of certainty regarding the value of related bits. Through a series of iterations the LDPC decoder may converge on a level of certainty (correctness) or uncertainty (error) regarding any codeword received on the digital channel.

The Related Patents identified above describe aspects of a pipelined LDPC decoder that is well suited to parallel processing computations in the processing of each received codeword through the LDPC decoder of a digital channel. The circuits to provide such parallel computation of the LDPC decoder are complex. The Related Patents present an architecture with a plurality of bit nodes/units ("bit & memory logic") and a plurality of check/parity nodes/units ("parity memory logic") coupled through a bidirectional interleaver circuit (e.g., a programmable switch) all coupled to control logic (a controller) to sequence the computations and exchanges of messages between the bit nodes and the check nodes.

It is an ongoing challenge to design simpler circuits for the check nodes (parity units) that compute the parity using the parity check matrix ("H") in such a parallel, pipelined LDPC decoder.

SUMMARY

The present invention solves the above and other problems, thereby advancing the state of the useful arts, by providing a parity unit circuit that is structured for simplicity and speed. Each parity unit performs the function of a "check node" in the LDPC parallel architecture decoder of the Related Patents. The parity unit circuit comprises three logic blocks: a memory logic block that stores data for the current and next iteration of the LDPC decoder; a first compute logic block that retrieves data from the memory that computes the final parity message value and its sign and transfers the value to the LDPC decoder for exchange with appropriate bit units; and a second compute logic block that retrieves data from the memory, computes new values for the next iteration, and updates the data stored in the memory. This parity unit circuit structure allows for high performance while maintaining a smaller area utilization on the LDPC integrated circuit die as compared to prior approaches.

In one aspect, a parity unit is provided for use in a parallel pipelined low density parity check (LDPC) circuit having a plurality of bit units and having a plurality of parity units controllably coupled with the plurality of bit nodes and having a controller for sequencing operation of the bit nodes and operation of the parity units for exchanging bit messages. The LDPC decoder operable to perform an iterative, message passing, min-sum algorithm. Each parity unit includes a memory logic block adapted to store data relating to parity check computation of the parity unit circuit, the memory logic block adapted to receive a next bit message (bit_mes) from each bit node that participates in the parity computation of the parity unit. Each parity unit also includes a first computational logic block coupled to the memory logic block, adapted to retrieve data from the memory logic block and adapted to compute a parity message (par_mes) and a corresponding sign (par_sign) of the parity message and adapted to output the parity message and the corresponding sign for application to a bit node under control of the controller. Each parity unit also includes a second computational logic block coupled to the memory logic block, adapted to retrieve data from the memory logic block and adapted to compute new values and adapted to store the new values in the memory logic block, the second computational logic block adapted to receive a next bit message (bit_mes) from a bit node and adapted to receive a sign of the bit message (bit_sign) from each bit node that participates in the parity computation of the parity unit and adapted to receive a hard decision value (bit_hard) from each bit node.

BRIEF DESCRIPTION OF THE DRAWINGS

FIG. 2 is an example of an LDPC encoding matrix according to an exemplary embodiment of the present invention.

DETAILED DESCRIPTION OF THE DRAWINGS

Figure 1:
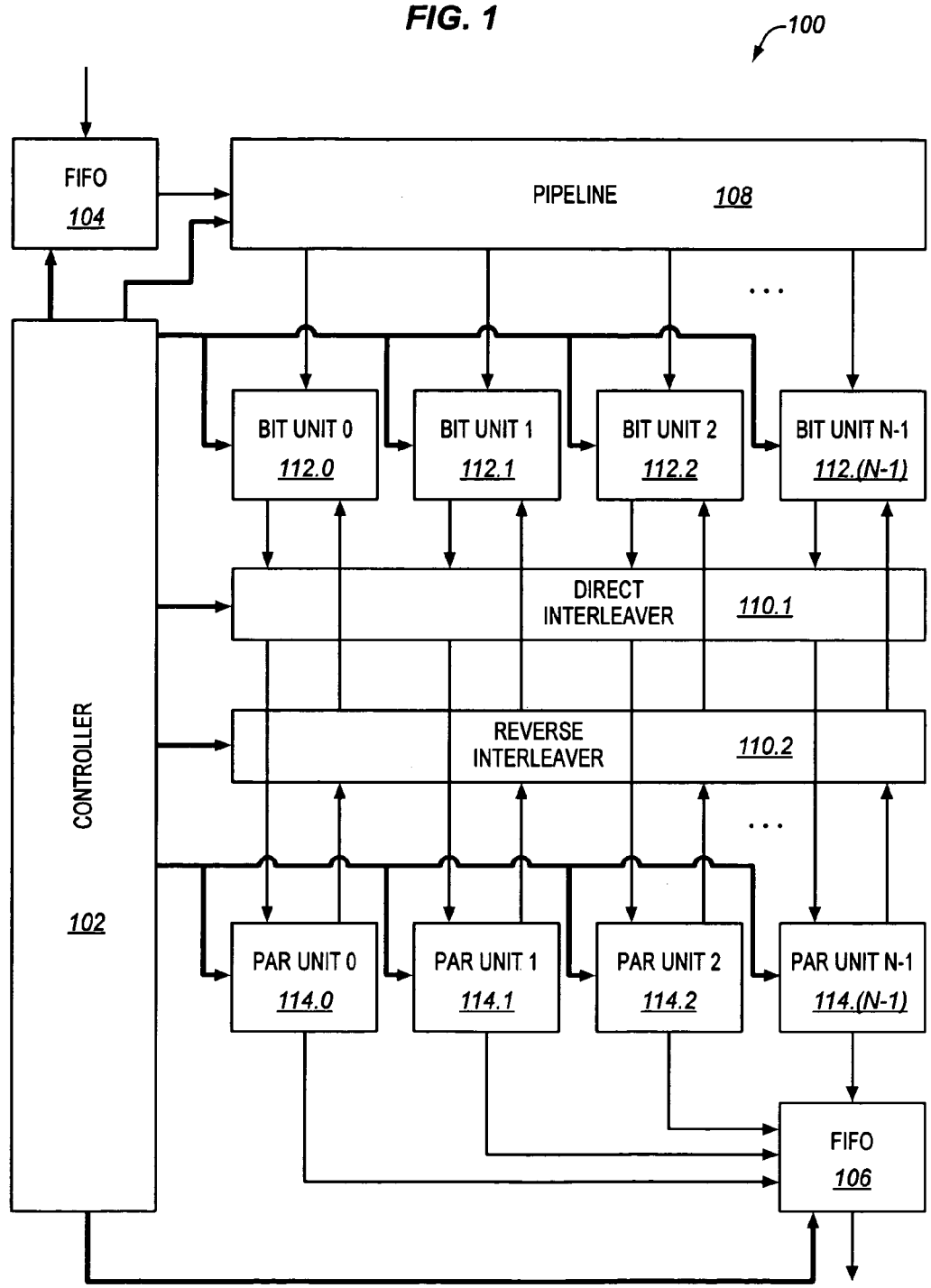
FIG. 1 is a functional block diagram of a parallel, pipelined LDPC decoder in which a plurality of parity units according to an exemplary embodiment of the present invention may be applied.

FIG. 1 depicts one exemplary embodiment of a parallel, pipelined LDPC decoder 100. The decoder 100 includes a controller 102, an input FIFO 104 (first-in, first-out buffer, from the Viterbi decoder), an output FIFO 106 (first-in, first-out buffer for the final hard decision, or to another process, such as a Reed-Solomon computation), a pipeline 108, two interleavers 110.1 and 110.2, and t functional units of two types: bit units (112.0 through 112.(N-1)) and parity units (114.0 through 114.(N-1), all as depicted in FIG. 1. The bit units calculate data on bit nodes, and the parity units calculate data on check nodes.

Each parity unit 114 may contain pipelined memory (discussed further herein below) for storing values relating to a current iteration of the decoder 100 and values relating to a next iteration of the decoder 100. Each bit unit 112 may contain similar pipelined memory for storing its values relating to current and next iterations of the decoder 100. Each parity unit 114 is preferably pipelined, meaning that it can store data for a few different nodes at the same time. In the embodiment depicted the arithmetic unit is separated for simplification and to show all the more relevant connections. However, the present invention is applicable to a wide variety of arithmetic unit architectures that are capable of performing calculations discussed in the '008 co-pending patent. Also, in the embodiment as depicted in FIG. 1, memories are embedded into the arithmetic unit, but in other embodiments they could be separate from the arithmetic unit.

A special parity check is used for (m,n) matrices H for LDPC-codes, which parity check can be represented by a matrix (M,N) from permutation (r,r) cell $H_{i,j}$, where m=M·r, n=N·r, and r(mod t)=0. An example of the matrix H is given in FIG. 2, where M=3, N=7, r=8, m=24, and n=56. The permutation matrix contains exactly one value of one in each sub row and sub column. To reduce the number of operations per circuit gate, circulant permutation matrices are used in one embodiment, which matrices are determined by formula:

$$p(j)=p(0)+j(\bmod r)$$

where p(i) is the index of the column with a value of one in $i^{th}$ row. For example, p(0)=2 for the upper left cell in FIG. 2 (where counting of both rows and columns starts with zero). Thus, we can use the initial index p(0) of one in the first row to determine each circulant permutation matrix. Similarly, the function c(j) returns the index of row with a value of one in the $j^{th}$ column.

The calculations performed in the LDPC decoder are summarized as follows:

Initial Step:

For each parity w and code bit v calculate:

$$md\_m[v]=P_v(0)/P_v(1),$$

$$md\_g[v][w]=md\_m[v],$$

$$md\_R[w]=md\_m[v], w \in O(v)$$

where $P_v(0)$ and $P_v(1)$—possibilities (from Viterbi decoder) that bit v equal 0 and 1, O(v) denotes set of all parities w that include code bit v.

Regular Step (Single Iteration):

$$cur\_sum_k = \sum_{i=0}^{d-1} cur\_sum_i + channel\_value - cur\_sum_k^{old}$$

$$S[v] = \left(\prod_{w \in O(v)} \frac{md\_R[w]}{md\_g[v][w]}\right) \cdot md\_m[v], \quad (1)$$

$$loc\_item[v][w] = \frac{md\_R[w]}{md\_g[v][w]}, \quad (2)$$

$$md\_g\_new[v][w] = \frac{S[v]}{loc\_item[v][w]}, \quad (3)$$

$$md\_R\_new[w] = f^{-1}\left(\prod_{v \in O(w)} f(md\_g\_new[v][w])\right), \quad (4)$$

where $$f(x) = \frac{1+x}{1-x} - \text{Gallager function},$$

O(w)—all code bits from parity w, O(v)—all parities w that includes code bit v.

Calculate (1)-(2) for v=i and (3)-(4) for v=i−1, then (1)-(2) for v=i+1 and (3)-(4) for v=i and so on through pipeline in arithmetic unit. When all code bits v are passed, assign $$md\_g[v][w]=md\_g\_new[v][w], \quad (6)$$

$$md\_R[w]=md\_R\_new[w], \quad (7)$$

for each bit v and parity w. A single iteration is now done and has generated a hard decision for each code bit v during single iteration:

$$hard\_decision[v] = 0 \text{ if } sign\left(\prod_{w \in O(v)} loc\_item[v][w]\right) = 1 \quad (8)$$

$$hard\_decision[v] = 1 \text{ if } sign\left(\prod_{w \in O(v)} loc\_item[v][w]\right) = -1 \quad (9)$$

Products from formulas (8) and (9) were already calculated by equation (1) for S[v]. Preferably the calculations are performed in a logarithmic domain, so all products will be replaced by sums in implementation of an arithmetic unit.

Figure 3:
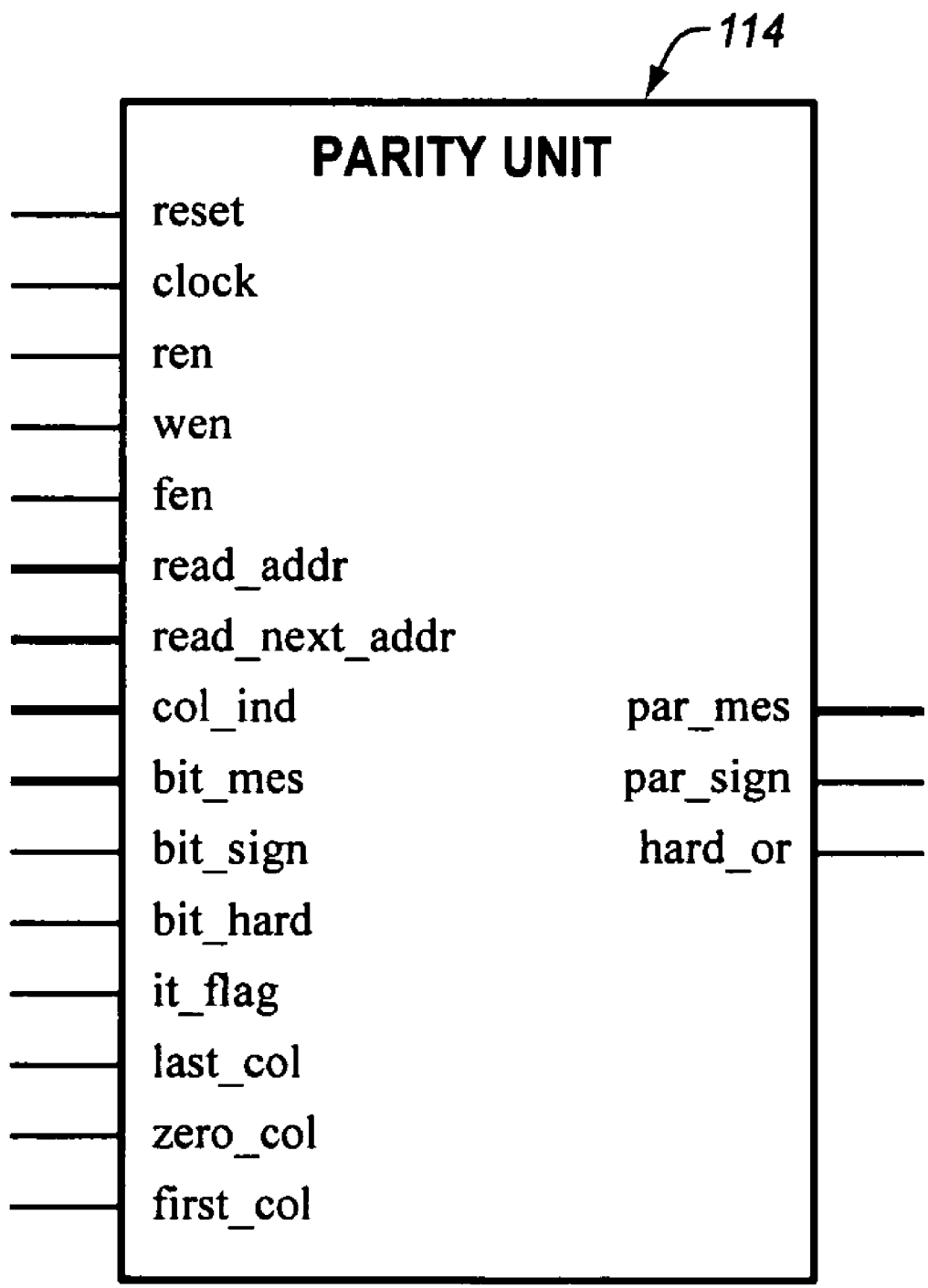
FIG. 3 is a block diagram of an exemplary parity unit according to an exemplary embodiment of the invention showing exemplary input and out signals for coupling with other elements of the LDPC decoder of FIG. 1.

In the LDPC decoding algorithm summarized above and discussed in the '008 patent publication, the log-likelihood messages are exchanged between the bit units 112 (bit nodes) and the parity units 114 (check nodes). FIG. 3 describes an exemplary embodiment of a parameterized parity unit module for the implementation of the parity unit (check node) function. Its simple architecture provides significant area savings of an LDPC decoder integrated circuit because of its many instances inside the decoder and also achieves desired throughput. For example, the exemplary embodiment parity unit of FIG. 3 functions on 1.4 Gz in the 65 nm technology.

Figure 9:
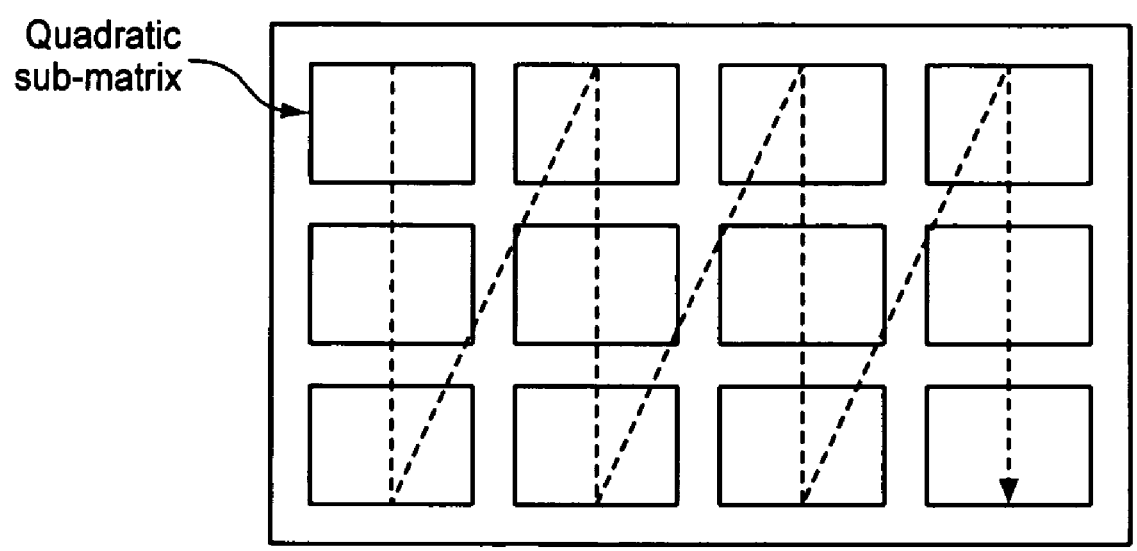
FIG. 9 is a diagram suggesting the logical subdivision of a parity matrix into a plurality of quadratic sub-matrices according to an embodiment of the invention.

The parity unit 114 of FIG. 3 is operable in a parallelized decoder that sequentially processes columns of a parity check matrix (e.g., H of FIG. 2). As noted above, parity matrix H may be logically subdivided by rows and columns to define quadratic sub-matrices. FIG. 9 shows such a logical subdivision of the parity matrix into quadratic sub-matrices with an arrow indicating an order in which the sub-matrices may be processed to provide parallel, pipelined LDPC decoding of received codewords. In such an organization the resources of one parity unit can be used for processing of several parity equations -i.e., several rows of the party check matrix (in that case the capacity of the parity unit memory is greater than 1 and the memory holds the data for several selected rows from each sub-matrix row).

Exemplary embodiments of logic blocks 400, 402 and 404 of the parity unit 114 are shown in FIG. 3. The parity unit computes a parity message as follows:

$$c_{mm}^{(i)} = \min|b_{km}^{(i)}| * \Pi\text{sign}(b_{km}^{(i)}) \quad (10)$$

where: $c_{mm}^{(i)}$—a parity check message sent from a check node m to a bit node n during i-th iteration, $b_{km}^{(i)}$—a bit message sent from a bit node k that participates in a parity equation m to the check node m (during i-th iteration). Finding the minimal value and multiplying the signs in expression (10) is done over each bit that participates in the parity equation, excluding the bit n. FIG. 2 shows the interface of a module that calculates $c_{mm}^{(i)}$.

The input ports shown on the left side of the parity unit 114 in FIG. 3 receive values from the controller inside the LDPC decoder and from the modules that process the bit nodes (as discussed below). Ports 'ren', 'wen' and 'fen' are used by the controller to enable the internal memory operations: read/write enable and the flip enable respectively (the internal memory has two parts and the content transfer from one to the other at the end of an iteration is called 'flip'). Ports read_addr and read_next_addr are also sent from the controller and they choose the memory location that holds the data for a specific row of a sub-matrix (as shown in FIG. 9). The ports it_flag, col_ind, last_col, zero_col, first_col are used to indicate the non-zero iterations and the current column of a parity check matrix (as shown in FIG. 9). The ports bit_mes, bit_sign, bit_hard come from a specific bit node unit as directed by the controller: bit_mes corresponds to $b_{km}^{(i)}$ from equation (10) and bit_sign represents its sign bit while bit_hard is a hard decision of a bit value.

The two outputs of the parity unit, par_mes and par_sign are the values of a message $c_{mm}^{(i)}$ from equation (10) and its sign respectively. The port hard_or is used to indicate when all the parity equations are satisfied so the codeword is completely decoded and the decoder can stop its work.

The width of the buses, capacity of the internal memory, and whether the ports are registered are all determined by the generation parameters as a matter of design choice in implementing the parity unit 114 in a circuit design.

Figure 4:
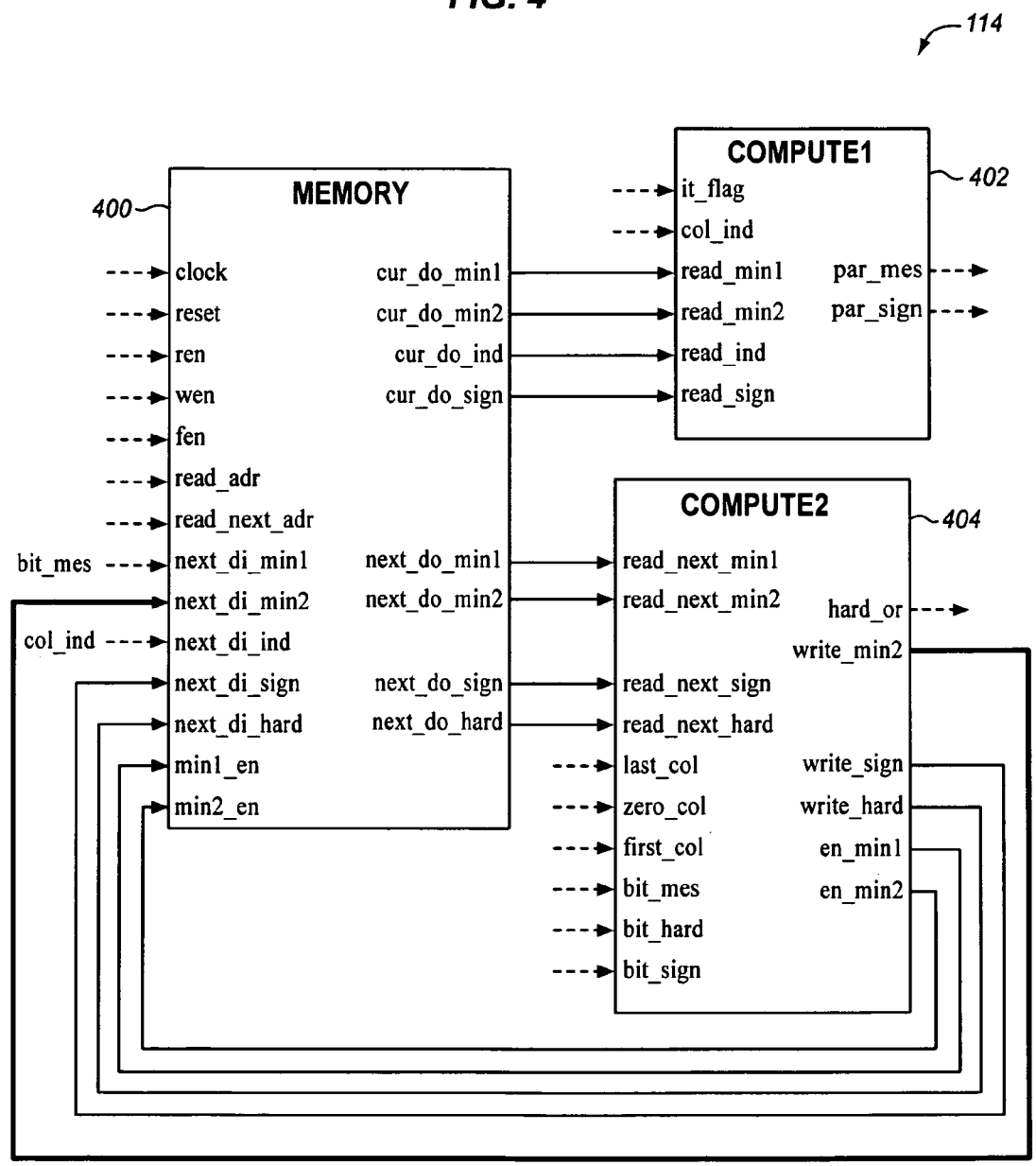
FIG. 4 is a block diagram of an exemplary decomposition of the parity unit of FIG. 3 into a memory logic block, a "compute1" logic block, and a "compute2" logic block according to an exemplary embodiment of the invention.

FIG. 4 is a block diagram depicting an exemplary implementation of a parity unit 114 having a dedicated memory logic block 400 associated with corresponding computational elements COMPUTE1 402 and COMPUTE2 404. It will be apparent to those of ordinary skill in the art as discussed further below that such a dedicated memory associated with each parity unit 114 may have a memory capacity of 1 (i.e., for computing parity information relating to a single row of the matrix). By contrast, where a memory is provided with a larger capacity (i.e., several rows of the parity check matrix), each parity unit may operate to compute parity check values for multiple rows of the matrix (thus providing still further area savings on the integrated circuit die).

As can be seen in FIGS. 3 and 4, the two minimum values are used for the calculation of the expression (10) above (they will be referred to in the text by their suffixes '_min1' and '_min2'): the '_min1' is a minimum value of all the bit messages that participate in one parity equation while '_min2' is the first next minimum of these messages. Thus it is always satisfied '_min2'>='_min1'.

The ports with the suffix '_ind' (except the top-level port col_ind, which is explained above) hold the index of the column where '_min1' is found (the parity matrix is constructed in such a way that each row of a 'sub-matrix' (as in FIG. 9) contains only one value '1' so this index also represents a bit that participates in a parity equation that is processed). A port with the suffix '_sign' is used for the calculation of the product of signs of the incoming bit node messages, expression (10). A port with the suffix '_hard' is used to calculate the output hard_or (discussed above).

The module MEMORY 400 on FIG. 4 contains two banks of registers and the logic for keeping and updating the data for the current and the next iteration (prefix 'cur_' and 'next_'). The module COMPUTE2 404 on FIG. 4, receives the set of the data values from MEMORY 400, calculates the new values, and updates the content of MEMORY 400 using the connections shown on FIG. 4. It also generates hard or as its output. The module COMPUTE1 402 on FIG. 4 reads from MEMORY 400 and sends the final parity message $c_{mm}^{(i)}$ (par_mes), expression (10), and its sign (par_sign) to the outside (i.e., for application by the controller to appropriate bit units in FIG. 1).

Exemplary embodiments of the logic blocks COMPUTE1 402 and COMPUTE2 404 operate with the width of 5 for the buses carrying the two minimum values and 6 for the column index, while the capacity of the logic block MEMORY 400 may range from 1 to 7.

Figure 7:
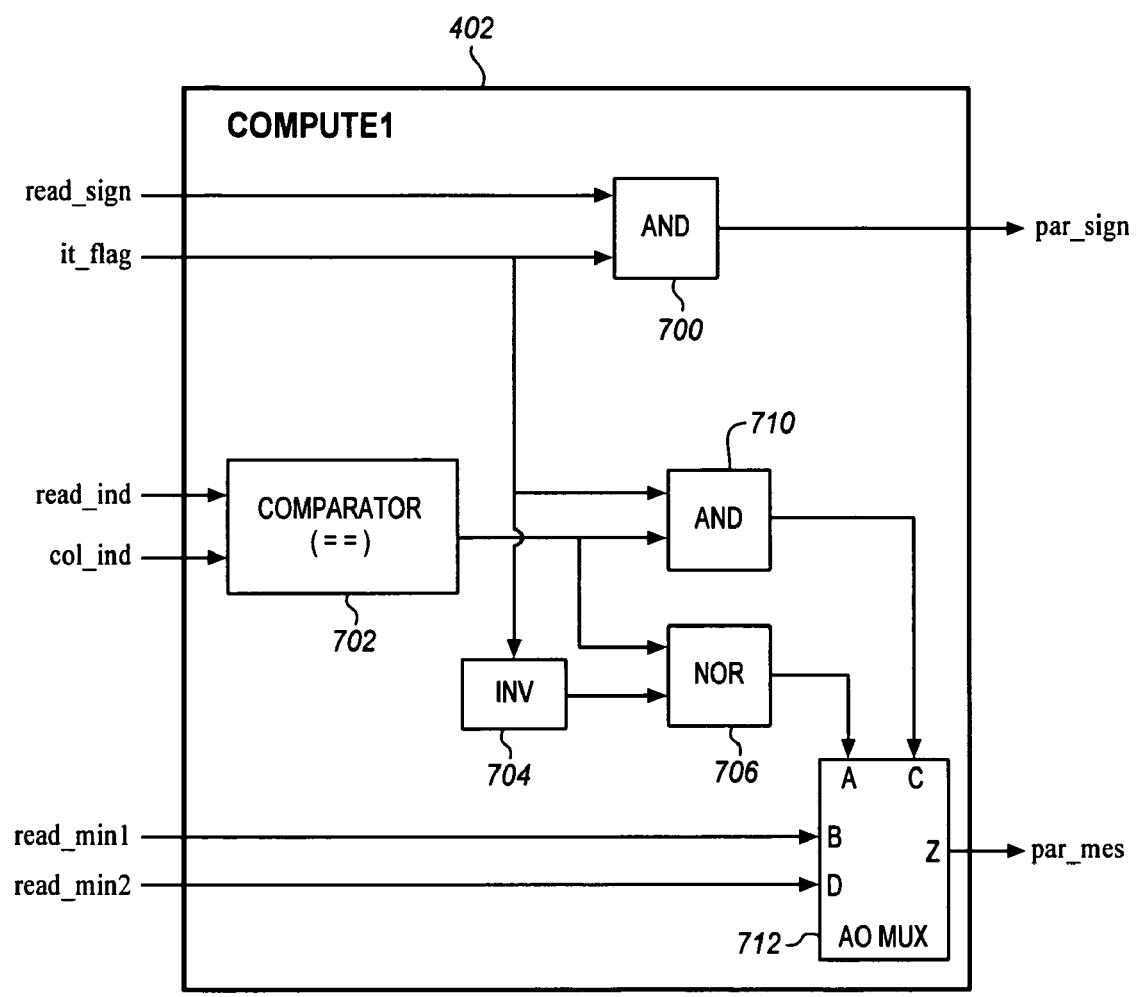
FIG. 7 is a block diagram of an exemplary embodiment of a "compute1" logic block as in FIG. 4 according to an embodiment of the invention.

FIG. 7 is a block diagram of an exemplary embodiment of the logic block COMPUTE1 402 of FIG. 4. Ports par_mes and par_sign start from the zero value because of it_flag, which is zero in the case of the zero-th (starting) iteration. it_flag and read_sign input signals are applied as inputs to AND gate 700 which outputs the logical and as par_sign. For the rest of the iterations (when it_flag is non-zero), par_sign is actually a bit that is stored in MEMORY 400 of FIG. 4 and is applied as the read_sign input to AND gate 700. Inputs read_ind, col_ind, read_min1, read_min2, par mes are buses with signals applied from MEMORY 400 of FIG. 4.

For the non-zero iterations par_mes is one of the minimum values that come from outputs of MEMORY 400 of FIG. 4 applied as inputs as read_min1 or read_min2. Which one of these values is used in COMPUTE1 is decided based on indexes read_ind and col_ind: if they are equal, meaning the minimum of all the incoming bit messages is found exactly at the position of the bit which receives the actual parity message, then read_min2 is used as the par_mes output of COMPUTE1; otherwise read_min1 is used. Comparator 702 compares read_ind and col_ind to make the determination that the two values are equal or not equal. AND gate 710 and NOR gate 706 each receive the output of comparator 702 as one input and receive it _flag as the other input (inverted by inverter 704 for input to NOR gate 706 ). The outputs of AND gate 710 and NOR gate 706 are applied as inputs 'C' and 'A', respectively to 'AO MUX" 704. 'AO MUX' is an optimized cell whose output (par_mes) is Z=AB+CD, where AB and CD means that each bit of bus 'B' (read_min1) and each bit of bus 'D' (read_min2) is logically ANDed with bit 'A' and bit 'C', respectively.

The par_mes and par_sign outputs of logic block COMPUTE1 402 are applied (under control of the LDPC decoder's controller of FIG. 1) to corresponding bit units as the LDPC decoder sequences through iterations.

Figure 8:
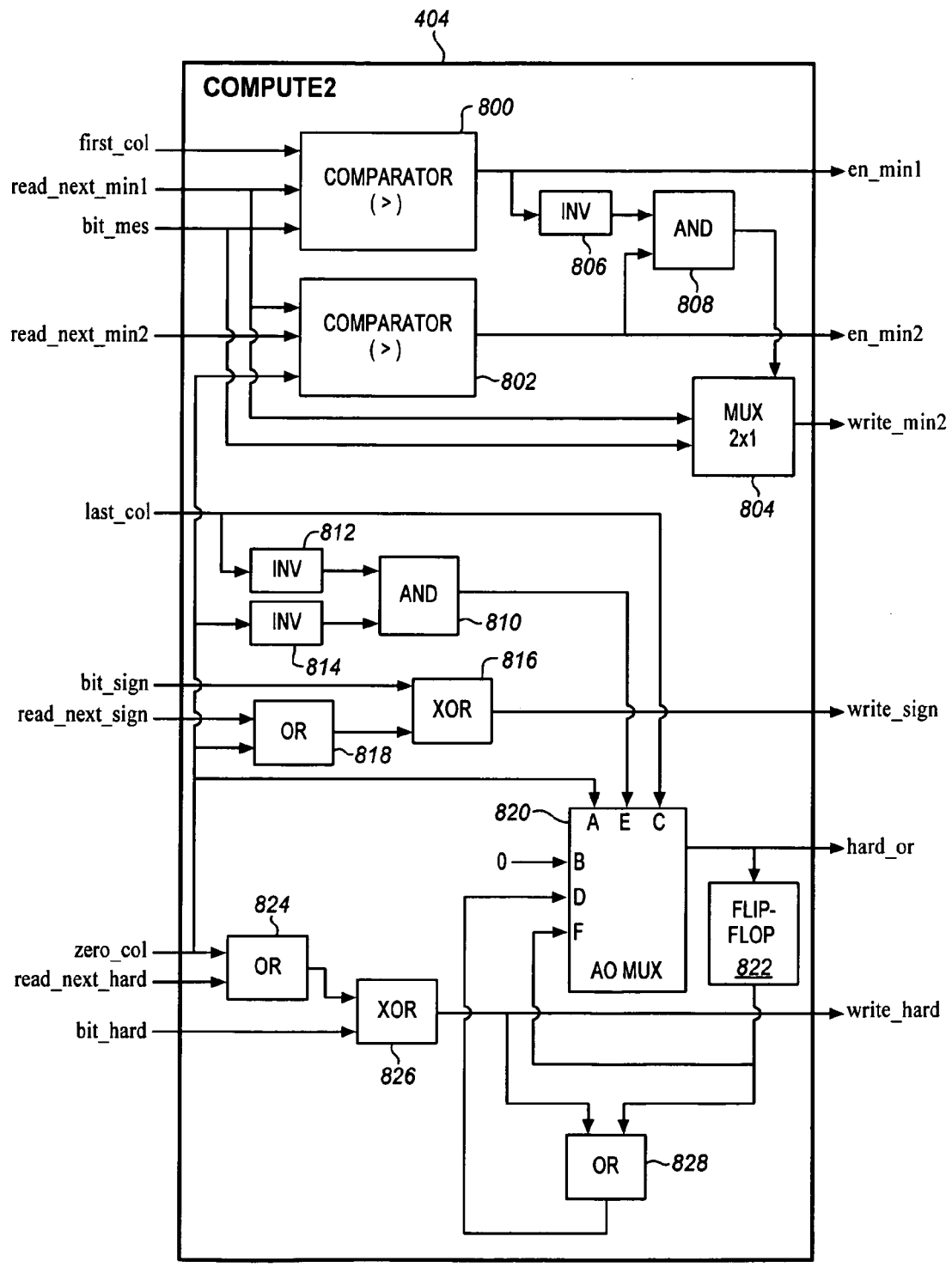
FIG. 8 is a block diagram of an exemplary embodiment of a "compute2" logic block as in FIG. 4 according to an embodiment of the invention.

FIG. 8 is a block diagram of an exemplary embodiment of the logic block COMPUTE2 404 of FIG. 4. Input ports read_next_min1, read_next_min2, read_next_sign, and read_next_hard are received as outputs from MEMORY 400 of FIG. 4. Input ports last_col, zero_col, first_col, bit_mes, bit_hard, and bit_sign are received as outputs from the bit units and/or the controller of the LDPC decoder of FIG. 1. Input ports bit_mes, read_next_min1 and read_next_min2 are buses and the other input ports are one bit signals.

Two enable signals, en_min1 and en_min2, control when the new minimal values 'read_next_min1' and 'read_next_min2' and the index of a bit with 'read_next_min1' value are written to MEMORY 400 of FIG. 4. The comparison of a bit node message bit_mes (received from a bit unit of the LDPC decoder under control of the LDPC decoder's controller) and the current minimums read_next_min1 and read_next_min2 is done by the two 'greater-than' comparators 800 and 802. Each comparator has an optimized depth and an additional input, which forces the output to zero regardless of the compared values. Comparator 800 outputs en_min1 when the read_next_min1 value is greater than the bit_mes value and first_col is cleared to zero. Comparator 802 outputs en_min2 when the read_next_min2 value is greater than the bit_mes value and zero_col is set to one. This feature is used for each iteration to set the initial values of 'en_min1' and 'en_min2' when the zero-th column (for comparator 802) and the first column (for comparator 800) of the parity check matrix are encountered (the ports zero_col and first_col are applied as inputs to the logic block COMPAUTE2 by the LDPC decoder's controller logic). 'write_min_2' is the output of a multiplexer 'MUX 2×1' 804 and it is sent from this module to MEMORY 400 of FIG. 4. MUX 804 receives the read_next_min1 and read_next_min2 signals as inputs and selects one for application to write_min2 based on the selection signal output from AND gate 808. AND gate 808 receives the en_min2 signal from comparator 802 as one input and the en_min1 signal from comparator 800 inverted through inverter 806.

The port write_sign is the output of XOR gate 816 whose inputs are Bit_sign from the bit unit and read_next_sign stored in MEMORY 400 and OR'd by gate 818 with the zero_col input port. This XOR of bit sign and read_next_sign calculates the product of signs of all the bits participating in processed parity equation.

The port hard_or, as explained earlier, is the indicator when all the parity equations are satisfied. It is the output of a cell named 'AO MUX' 820 which is an optimized 'AND-OR' cell having inputs 'A', through 'F' with the output Z=AB+CD+EF. In effect, AO MUX 820 is a customized multiplexor that output its "B" input if "A" selection input is active, outputs it "D" input if it "C" selection input is active, and outputs its "F" input if its "E" selection input is active. The "Z" output of AO MUX 820 is the hard_or signal to be applied to the MEMORY 400 for use in the next iteration. The "A" input is the zero_col input from the LDPC controller indicating the zero'th (e.g., first) column is being processed and the resulting hard_or (Z) output is then the "B" input or 0. The "C" input is the last_col input from the LDPC controller indicating when the last column of the parity computation is being processed and the resulting hard or (Z) output is the logical OR of the output of flipflop 822 (the hard_or from the previous iteration) and the output of XOR gate 826. XOR gate 826 receives the bit_hard input signal from the LDPC controller and the output of OR gate 824. OR gate 824 receives zero_col input from the LDPC controller and the read_next_hard input from MEMORY 400 (generated therein as the next_do_hard output signal). The port write_hard is stored in MEMORY 400 and is generated as the output of XOR gate 826 as above.

Figure 5:
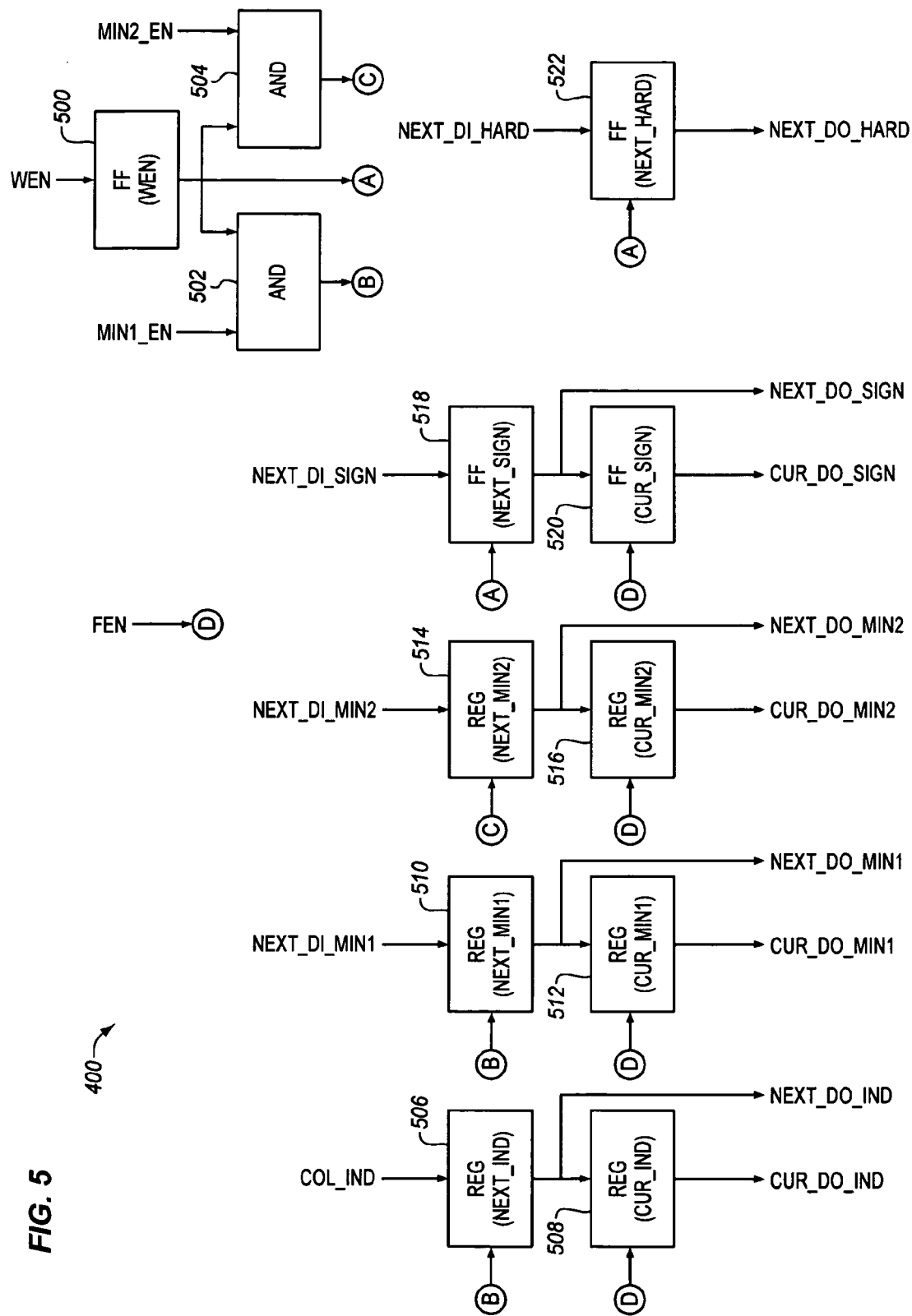
FIG. 5 is a block diagram of an exemplary memory logic block as in FIG. 4 optimized for a capacity of one according to an exemplary embodiment of the invention.

FIG. 5 is a block diagram of an exemplary embodiment of the logic block MEMORY 400 of FIG. 4. This module is specific type of memory for storing the information about parity nodes. The number of parity units for which MEMORY 400 stores data relating to a current and next iteration is referred to herein as the capacity of this memory. The purpose is to construct fast parity memory with optimal area for small capacities (<8). Regular LBRAM memories may provide better area in case of greater capacity.

Figure 6:
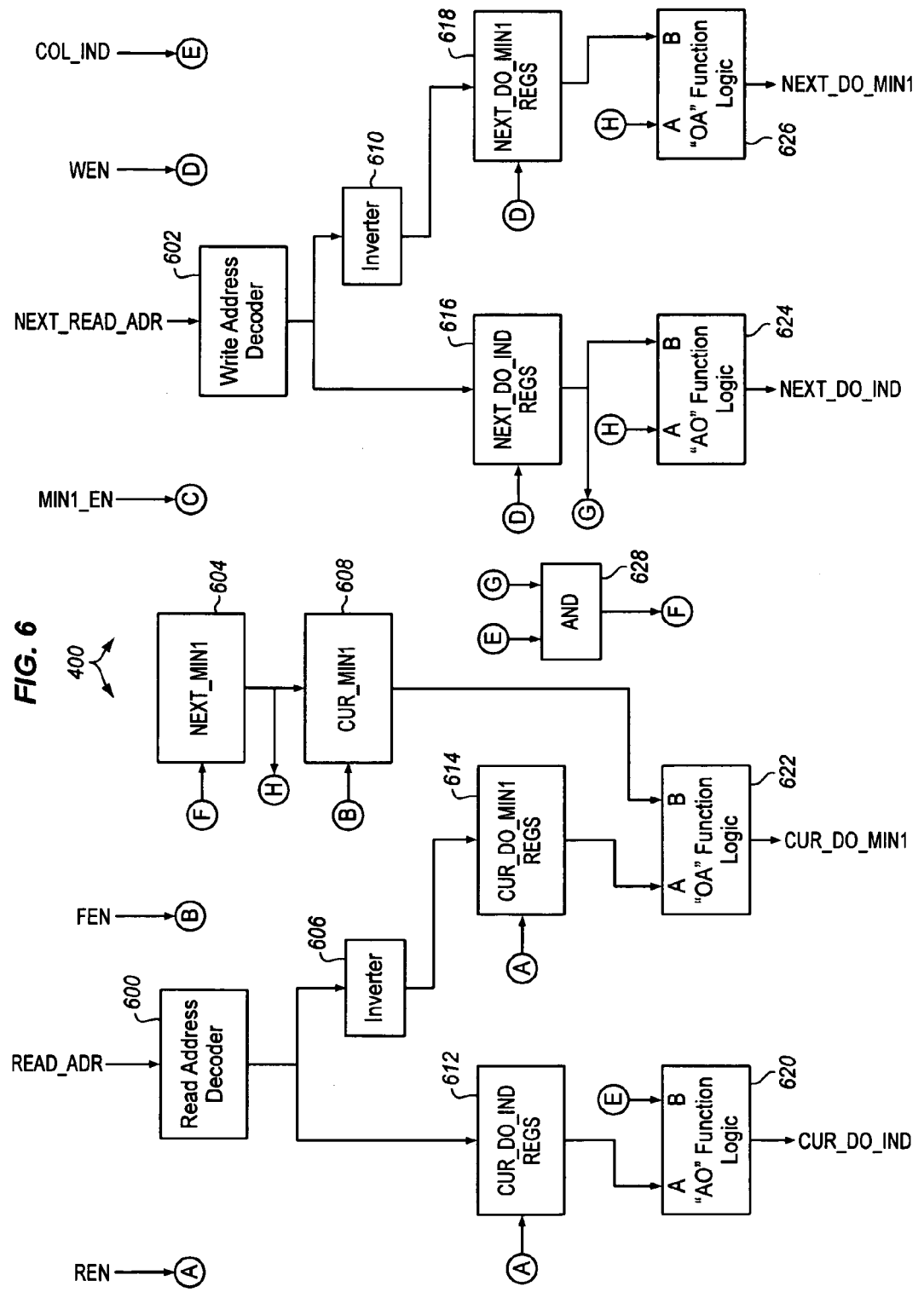
FIG. 6 is a block diagram of an exemplary memory logic block as in FIG. 4 optimized for a capacity greater than one according to an exemplary embodiment of the invention.

FIGS. 5 and 6 depict aspects of an exemplary MEMORY 400 for capacity of one and for capacity greater than one, respectively. Input ports of MEMORY 400 include: ren (read enable), wen (write enable),fen (switch enable), clock, reset, read_adr (read address), read_next_adr (write address), bit_mes (received as next_di_min1), and col_ind (received as next_di_ind) all received from the controller of the LDPC decoder of FIG. 1. Further inputs, min1_en, min2_en, next_di_min2, next_di_sign, and next_di_hard are received as outputs from logic block COMPUTE2 404 discussed above (with output signal names and connections as indicated in FIGS. 4 and 8 discussed above).

Based on the applied signals including the ren, wen, fen, min1_en, and min2_en to enable changes to outputs for current iteration and a next iteration of the LDPC decoder, MEMORY 400 generates outputs as follows: cur_do_min1, cur_do_min2, cur_do_ind, cur_do_sign, next_do_min1, next_do_min2, next_do_ind, next_do_sign, and next_do_hard. The outputs for the current iteration ("cur_*") are applied as inputs to the logic block COMPUTE1 402 of FIGS. 4 and 7 discussed above. The outputs for the next iteration ("next_*") are applied as inputs to the logic block COMPUTE2 404 of FIGS. 4 and 8 discussed above.

FIG. 5 depicts an exemplary embodiment of a MEMORY 400 with capacity one—a typical embodiment in the LDPC decoder of FIG. 1. In a memory having capacity on (i.e., for a parity unit to compute parity for a single row of the matrix), inputs read_adr and read_next_adr are unused. Rather, they are used in a memory implementation (as discussed below) having a capacity greater than one to allow computation of multiple row parity values by a single parity unit. The col_ind input signal is applied as input to the NEXT_IND register 506 which is enabled to generate its output (next_do_ind) by the logical AND 502 of wen (in wen flipflop 500) and min1_en received from the LDPC decoder's controller and from the logic block COMPUTE2 404, respectively. The output of the NEXT_IND register 506 is applied as input to the CUR_IND register 508 which is enabled to generate its output (cur_do_ind) byfen. Output signals cur_do_min1 and next_do_min1 are similarly generated from input next_di_min1 applied to NEXT_MIN1 register 510 and CUR_MIN1 register 512 (using the same enable signals as above). Output signals cur_do_min2 and next_do_min2 are similarly generated from input next_di_min2 applied to NEXT_MIN2 register 514 and CUR_MIN2 register 516. Register 514 is enabled to apply its output by the logical AND 504 of wen (in wen flipflop 500) and min2_en. Register 516 is enabled to apply its output by fen. Output signals cur_do_sign and next_do_sign are similarly generated from input next_di_sign applied to NEXT_SIGN flipflop 518 and CUR_SIGN flipflop 520. Flipflop 518 is enabled to apply its output by wen (in wen flipflop 500). Flipflop 520 is enabled to apply its output byfen. Output signal next_do_hard is generated from input next_di_hard applied as input to NEXT_HARD flipflop 522 enabled to generate its output by wen (in wen flipflop 500). Flops NEXT* accumulate data during an iteration (i.e., for a next iteration) and flops CUR* store data for current iteration. When an iteration is done (FEN=1), data from NEXT* flops is transferred to CUR* flops in one atomic operation.

FIG. 6 depicts a portion of an exemplary embodiment for MEMORY 400 for a capacity greater than one. The circuit has two address decoders (for read address and write address). As noted above, the LDPC control element may present a row address to the memory where the memory (as in FIG. 6) is adapted to store data for multiple rows of parity computations by a parity unit. The address is decoded to identify the particular row for the parity computation presently active in a parity unit. A read adr input is applied to decoder 600 to decode the address. The decoded address is represented as a sequence of bits with one bit on representing the row presently being computed by the parity unit. For example, where the memory capacity is 8, a three bit encoded address is decoded to an 8 bit field with one of the 8 bits set to indicate the row being processed. The decoded address is applied as an input to registers 612 (thereby selecting one of the plurality of registers 612) enabled to generate its output by ren. The output of decoder 600 is also inverted by inverter 606 and applied as an input to select one of registers 614 which is enabled to generate its output by ren. The output of the selected register 612 and the col_ind input are applied as inputs 'A' and 'B', respectively, to AO function 620. AO function 620 computes the logical function $A_0\&B_0 \vee A_1\&B_1 \vee \ldots \vee A_{n-1}\&B_{n-1}$ as its output cur_do_ind. Register NEXT_MIN1 604 receives next_di_min1 as its input and is enabled to generate its output by the logical AND 628 of col_ind and the output of register 616 (discussed below). The output of NEXT_MIN1 604 is applied as input to register CUR_MIN1 608 enabled to generate its output byfen. The output of the selected register 614 and the output of CUR_MIN1 608 are applied as inputs to OA function 622 as inputs 'A' and 'B', respectively. OA function 622 computes the logical function $(A_0 \vee B_0)\&(A_1 \vee B_1)\& \ldots (A_{n-1} \vee B_{n-1})$ as its output cur_do_min1.

Write address decoder 602 receives next_read_adr as its input and applies its decoded output to select a register 616. The selected register 616 is enabled to apply its output by wen. The output of register NEXT_MIN1 604 and the output of the selected register 616 are applied to AO function 624 as inputs 'A' and 'B', respectively. AO function 624 computes its output using the same logic as function 620 above and applies its output as next_do_ind. The output of decoder 602 is also applied through inverter 610 to select a register 618 which is enabled to generate its output by wen. The output of register NEXT_MIN1 604 and the output of the selected register 618 are applied as inputs 'A', and 'B', respectively, which computes its output using the same logic as function 622 above. The output so generated is applied as next_do_min1.

FIG. 6 shows only the above portions of the embodiment of MEMORY 400 with a capacity greater than one. Additional circuits to generate cur_do_min2 (similar to that of cur_do_min1) and to generate next_do_min2 (similar to generation of next_do_min1) will be readily apparent to those of ordinary skill in the art and are thus omitted for simplicity of FIG. 6 and for brevity of this discussion. In like manner, a similar circuit to generate next_do_hard and cur_do_hard will be readily apparent and are omitted for simplicity and brevity herein.

Outputs of address decoders (600 and 602) and their negations (through inverters 606 and 610) may also be registered (not shown) for timing purposes.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A parity unit circuit operable in a parallel pipelined low density parity check (LDPC) decoder circuit having a plurality of bit nodes and having a plurality of such parity unit circuits controllably coupled with the plurality of bit nodes and having a controller for sequencing operation of the plurality of bit nodes and operation of the plurality of parity unit circuits for exchanging bit messages, the LDPC decoder circuit operable to perform an iterative, message passing, rainsum algorithm, each parity unit circuit comprising:

a memory logic block adapted to store data relating to a parity check computation of said each parity unit circuit, the memory logic block adapted to receive a next bit message (bit_mes) from each of the plurality of bit nodes that participates in the parity check computation of the parity unit circuit;

a first computational logic block coupled to the memory logic block adapted to retrieve data from the memory logic block, adapted to compute a parity message (par_mes) and a corresponding sign (par_sign) of the parity message, and adapted to output the parity message and the corresponding sign for application to a bit node under control of the controller; and a second computational logic block coupled to the memory logic block adapted to retrieve data from the memory logic block, adapted to compute new values, and adapted to store the new values in the memory logic block, the second computational logic block further adapted to receive a next bit message (bit_mes) from a bit node, adapted to receive a sign of the bit message (bit_sign) from said each bit node that participates in the parity check computation of the parity unit circuit, and adapted to receive a hard decision value (bit_hard) from said each bit node, wherein said each parity unit circuit comprises the memory logic block corresponding to that parity unit circuit and wherein the memory logic block in said each parity unit circuit is dedicated to storing data pertaining to the that parity unit circuit.

2. The parity unit circuit of claim 1, wherein the second computational logic block is further adapted to compute a signal to indicate when all parity equations are satisfied such that a codeword is decoded (hard_or), and wherein the parity message and the corresponding sign of the parity message computed by the first computational block are applied to said each bit node that participates in the parity check computation of the parity block in response to application of the hard decision value to the controller.

3. The parity unit circuit of claim 1, wherein the data in the memory logic block includes current iteration data relating to a current iteration of the parallel pipelined LDPC decoder circuit and includes next iteration data relating to a next iteration of the parallel pipelined LDPC decoder circuit.

4. The parity unit circuit of claim 1,
wherein the parity unit circuit is coupled to receive bit_mes from each of x bit nodes and wherein the parity unit circuit is adapted to compute par_mes for iteration i of the parallel pipelined LDPC decoder circuit as:

$$\min|\text{bit\_mes}_k^{(i)}|*\Pi(\text{bit\_sign}_k^{(i)})$$

where:

$\text{bit\_mes}^{(i)}$ is the bit_mes received in the parity unit ciccuit from each bit node k that participates in the parity check computation of the parity unit circuit (k=0 ... x-1), min is a function that determines the minimum of the bit_mes values received from all k bit nodes that participate in the parity computation of the parity unit circuit, and $\Pi(\text{bit\_sign}_k^{(i)})$ is the product of the bit_sign received in the parity unit circuit from each bit node k that participates in the parity computation of the parity unit circuit (k= 0 ... x-1).

* * * * *